United States Patent
Schiller et al.

(10) Patent No.: US 6,423,403 B2
(45) Date of Patent: *Jul. 23, 2002

(54) PVD AL$_2$O$_3$ COATED CUTTING TOOL

(75) Inventors: Siegfried Schiller; Klaus Goedicke; Fred Fietzke, all of Dresden; Olaf Zywitzki, Freiberg, all of (DE); Mats Sjöstrand, Kista (SE); Björn Ljungberg, Enskede (ES); Tomas Hilding, Mariefred (SE); Viveka Alfredsson, Lund (SE)

(73) Assignees: Sandvik AB, Sandvik (SE); Fraunhofer Gesillschaft zur Forderung der Angewandten Forschung E.V., Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 09/782,226

(22) Filed: Feb. 14, 2001

Related U.S. Application Data

(63) Continuation of application No. 09/187,006, filed on Nov. 6, 1998, now Pat. No. 6,210,726.

(30) Foreign Application Priority Data

Nov. 6, 1997 (SE) ................................................ 9704066

(51) Int. Cl.$^7$ ................................................ B32B 7/00
(52) U.S. Cl. .................... 428/325; 428/323; 428/701
(58) Field of Search ................. 428/701, 325, 428/323

(56) References Cited

U.S. PATENT DOCUMENTS 5,478,634 A   12/1995   Setoyama et al.
5,487,625 A   1/1996    Ljungberg et al.

(List continued on next page.)

FOREIGN PATENT DOCUMENTS

DE    252 205     12/1987
EP    0 744 473   4/1996
GB    1 408 294   10/1975

OTHER PUBLICATIONS

J. Hagen et al., "Novel hybrid cells consisting of inorganic nanoparticles and an organic hole transport material," *Elsevier*, May 29, 1997.

F. Fietzke et al., "The deposition of hard crystalline Al$_2$O$_3$ layers by means of bipolar pulsed magnetron sputting," *Elsevier*, 1996. No month.

International Preliminary Examination Report for PCT/SE98/02009, dated Feb. 7, 2000.

J. A. Thornton et al., "Structure and Heat Treatment Characteristics of Sputter–Deposited Alumina", Ceramic Bulletin, vol. 56, No. 5, pp. 1977, 504–512. No month.

(List continued on next page.)

*Primary Examiner*—Archene Turner
(74) *Attorney, Agent, or Firm*—Burns, Doane, Swecker & Mathis, L.L.P.

(57) ABSTRACT

The present invention describes a coated substrate material. The coating is formed by one or more layers of refractory compounds of which at least one layer of fine-grained, crystalline γ-phase alumina, Al$_2$O$_3$, with a grainsize less than 0.1 μm. The Al$_2$O$_3$ layer is deposited with a bipolar pulsed DMS technique (Dual Magnetron Sputtering) at substrate temperatures in the range 450° C. to 700° C., preferably 550° C. to 650° C., depending on the particular substrate material. Identification of the γ-phase alumina is made by X-ray diffraction. Reflexes from the (400) and (440) planes occurring at the 2θ-angles 45.8 and 66.8 degrees when using Cu$_{K\alpha}$ radiation identify the γ-phase Al$_2$O$_3$. The alumina layer is also very strongly textured in the [440]-direction. The Al$_2$O$_3$ layer is virtually free of cracks and halogen impurities. Furthermore, the Al$_2$O$_3$ layer gives the cutting edge of the tool an extremely smooth surface finish.

4 Claims, 4 Drawing Sheets

U.S. PATENT DOCUMENTS

| | | |
|---|---|---|
| 5,503,912 A | 4/1996 | Setoyama et al. |
| 5,516,588 A | 5/1996 | van den Berg et al. |
| 5,587,233 A | 12/1996 | König et al. |
| 5,674,564 A | 10/1997 | Ljungberg et al. |
| 5,693,417 A | 12/1997 | Goedicke et al. |
| 5,698,314 A | 12/1997 | Goedicke et al. |
| 5,700,551 A | 12/1997 | Kukino et al. |
| 5,861,210 A | 1/1999 | Lenander et al. |
| 5,879,823 A | 3/1999 | Prizzi et al. |

OTHER PUBLICATIONS

R.F. Bunshah et al., "Alumina Deposition By Activated Reactive Evaporation", International Conference on Metallurgical Coatings, Apr. 8, 1976, pp. 211–216.

O. Zywitzki et al., "Correlation between structure and properties of reactively deposited $Al_2O_3$ coatings by pulsed magnetron sputtering", Surface & Coatings Technology, 94–95, 1997 pp. 303–308 No month.

F. Fietzke et al., "Pulsed Magnetron of Alumina Films: Crystalline Phases at Low Temperatures", No. 279 Jan.–Feb.–Mar. 1996, pp. 218–220.

O. Zywitzki et al., "Influence of coating parameters on the structure and properties of $Al_2O_3$ layers reactively deposited by means of pulsed magnetron sputtering", Surface & Coatings Technology, 86–87, pp. 640–647, 1996. No month.

O. Zywitzki et al., "Effect of the substrate temperature on the structure and properties of $Al_2O_3$ layers reactively deposited by pulsed magnetron sputtering", Surface and Coatings Technology 82 (1996) pp. 169–175. No month.

PVD AL$_2$O$_3$ COATED CUTTING TOOL

This application is a continuation, of application Ser. No. 09/187,006, filed Nov. 6, 1998, now U.S. Pat. No. 6,210,726.

FIELD OF THE INVENTION

The present invention relates to PVD Al$_2$O$_3$ coated hard material.

BACKGROUND OF THE INVENTION

The present invention describes a cutting tool for metal machining, having a body of cemented carbide, cermet, ceramics or high speed steel and on the surface of said body, a hard and wear resistant refractory coating is deposited. The coating is adherently bonded to the body and covering all functional parts of the tool. The coating is composed of one or more layers of refractory compounds of which at least one layer consists of fine-crystalline alumina, Al$_2$O$_3$, deposited by Physical Vapor Deposition (PVD) and the non-Al$_2$O$_3$ layer(s), if any at all, consists of metal nitrides and/or carbides with the metal elements chosen from Ti, Nb, Hf, V, Ta, Mo, Zr, Cr, W and Al.

It is well known that for cemented carbide cutting tools used in metal machining, the wear resistance of the tool edge can be increased by applying thin, hard surface layers of metal oxides, carbides or nitrides with the metal either selected from the transition metals from the groups IV, V and VI of the Periodic Table or from silicon, boron and aluminium. The coating thickness usually varies between 1 and 15 $\mu$m and the most widespread techniques for depositing such coatings are PVD and CVD (Chemical Vapor Deposition). It is also known that further improvements of the performance of a cutting tool can be achieved by applying a pure ceramic layer such as Al$_2$O$_3$ on top of layers of metal carbides and nitrides (U.S. Pat. No. 5,674,564; U.S. Pat. No. 5,487,625).

Cemented carbide cutting tools coated with alumina layers have been commercially available for over two decades. The CVD technique usually employed involves the deposition of material from a reactive gas atmosphere on a substrate surface held at elevated temperatures. Al$_2$O$_3$, crystallizes into several different phases such as $\alpha$(alfa), $\kappa$(kappa) and $\chi$(chi) called the "$\alpha$-series" with hcp (hexagonal close packing) stacking of the oxygen atoms, and into $\gamma$(gamma), $\theta$(theta), $\eta$(eta) and $\delta$(delta) called the "$\gamma$-series" with fcc (face centered cubic) stacking of the oxygen atoms. The most often occurring Al$_2$O$_3$-phases in CVD coatings deposited on cemented carbides at conventional CVD temperatures, 1000°–1050° C., are the stable alpha and the metastable kappa phases, however, occasionally the metastable theta phase has also been observed.

The CVD Al$_2$O$_3$ coatings of the $\alpha$-, $\kappa$- and/or $\theta$-phase are fully crystalline with a grain size in the range 0.5–5 $\mu$m and having well-facetted grain structures.

Deposition at a typical temperature of about 1000° C. causes the total stress in CVD Al$_2$O$_3$ coatings on cemented carbide substrates to be tensile in nature. The total stress is dominated by thermal stresses caused by the difference in thermal expansion coefficients between the substrate and the coating, less intrinsic stresses which have there origin from the deposition process itself and are compressive in nature. The tensile stresses may exceed the rupture limit of Al$_2$O$_3$ and cause the coating to crack extensively and thus degrade the performance of the cutting edge in particularly in certain applications, such as wet machining where the corrosive chemicals in the coolant fluid may exploit the cracks in the coating as diffusion paths.

Generally CVD-coated tools perform very well when machining various steels and cast irons under dry or wet cutting conditions. However, there exists a number of cutting operations or machining conditions when PVD-coated tools are more suitable e.g. in drilling, parting and threading and other operations where sharp cutting edges are required. Such cutting operations are often referred to as the "PVD coated tool application area".

Plasma assisted CVD technique, PACVD, makes it possible to deposit coatings at lower substrate temperatures as compared to thermal CVD temperatures and thus avoid the dominance of the thermal stresses. Thin Al$_2$O$_3$ PACVD films, free of cracks, have been deposited on cemented carbides at substrate temperatures 450°–700° C. (DE 41 10 005; DE 41 10 006; DE 42 09 975). The PACVD process for depositing Al$_2$O$_3$ includes the reaction between an Al-halogenide, e.g. AlCl$_3$, and an oxygen donor, e.g. CO$_2$, and because of the incompleteness of this chemical reaction, chlorine is to a large extent trapped in the Al$_2$O$_3$ coating and its content could be as large as 3.5%. Furthermore, these PACVD Al$_2$O$_3$ coatings are generally composed of, besides the crystalline alfa- and/or gamma-Al$_2$O$_3$ phase, a substantial amount of amorphous alumina, which in combination with the high content of halogen impurities, degrades both the chemical and mechanical properties of said coating, hence making the coating material less desirable as a tool material.

There exist several PVD techniques capable of producing refractory thin films on cutting tools and the most established methods are ion plating, DC- and RF magnetron sputtering, arc discharge evaporation, BAD (Ion Beam Assisted Deposition) and Activated Reactive Evaporation (ARE). Each method has its own merits and the intrinsic properties of the produced coatings such as microstructure/grain size, hardness, state of stress, intrinsic cohesion and adhesion to the underlying substrate may vary depending on the particular PVD method chosen. Early attempts to PVD deposit Al$_2$O$_3$ at typical PVD temperatures, 400°–500° C., resulted in amorphous alumina layers which did not offer any notable improvement in wear resistance when applied on cutting tools. PVD deposition by HF diode or magnetron sputtering resulted in crystalline $\alpha$-Al$_2$O$_3$ only when the substrate temperature was kept as high as 1000° C. (Thornton and Chin, Ceramic Bulletin, 56 (1977) 504). Likewise, applying the ARE method for depositing Al$_2$O$_3$, only resulted in fully dense and hard Al$_2$O$_3$ coatings at substrate temperatures around 1000° C. (Bunshah and Schramm, Thin Solid Films, 40 (1977) 211).

With the invention of the bipolar pulsed DMS technique (Dual Magnetron Sputtering) which is disclosed in DD 252 205 and DE 195 18 779, a wide range of opportunities opened up for the deposition of insulating layers such as Al$_2$O$_3$ and, furthermore, the method has made it possible to deposit crystalline Al$_2$O$_3$ layers at substrate temperatures in the range 500° to 800° C. In the bipolar dual magnetron system, the two magnetrons alternately act as an anode and a cathode and, hence, preserve a metallic anode over long process times. At high enough frequencies, possible electron charging on the insulating layers will be suppressed and the otherwise troublesome phenomenon of "arcing" will be limited. Hence, according to DE 195 18 779, the DMS sputtering technique is capable of depositing and producing high-quality, well-adherent, crystalline $\alpha$-Al$_2$O$_3$ thin films at substrate temperatures less than 800° C. The "$\alpha$-Al$_2$O$_3$ layers", with a typical size of the $\alpha$-grains varying between 0.2–2 µm, may also partially contain the gamma(γ) phase from the "γ-series" of the Al₂O₃ polymorphs. The size of the γ-grains in the coating is much smaller than the size of the α-grains. The γ-Al₂O₃ grainsize typically varies between 0.05 to 0.1 µm. In the Al₂O₃ layers where both modifications of γ- and α-phase were found, the γ-Al₂O₃ phase showed a preferred growth orientation with a (440)-texture. When compared to prior art plasma assisted deposition techniques such as PACVD as described in DE 49 09 975, the novel, pulsed DMS sputtering deposition method has the decisive, important advantage that no impurities such as halogen atoms, e.g. chlorine, are incorporated in the Al₂O₃ coating.

SUMMARY OF THE INVENTION

According to the present invention there is provided a cutting tool for metal machining such as turning (threading and parting), milling and drilling comprising a body of a hard alloy of cemented carbide, cermet, ceramics or high speed steel onto which a hard and wear resistant refractory coating is deposited by the DMS PVD method at substrate temperatures of 450° to 700° C., preferably at 550° to 650° C., depending on the particular material of the tool body The wear resistant coating is composed of one or more layers of refractory compounds of which at least one layer, preferably the outermost layer, consists of Al₂O₃ and that the innermost layer(s), if any at all, between the tool body and the Al₂O₃ layer, is composed of metal nitrides and/or carbides with the metal elements selected from Ti, Nb, Hf, V, Ta, Mo, Zr, Cr, W and Al. In contrast to the state of the art, the Al₂O₃ layers consist of high-quality, dense, fine-grained crystalline γ-Al₂O₃ with a grainsize less than 0.1 µm. Furthermore, the γ-Al₂O₃ layers are virtually free of cracks and halogen impurities.

The lack of impurities of the coating of the present invention is illustrated by comparing FIG. 1 with FIG. 2. FIG. 1 is an EDS-analysis of an Al₂O₃ layer deposited by PACVD (with Al₂O₃ as a precursor) containing Cl-impurities and FIG. 2 is an EDS-analysis of a γ-Al₂O₃ layer, according to the invention. In the latter Al₂O₃ layer no detectable impurities are present.

DETAILED DESCRIPTION OF THE INVENTION

Figure 1:
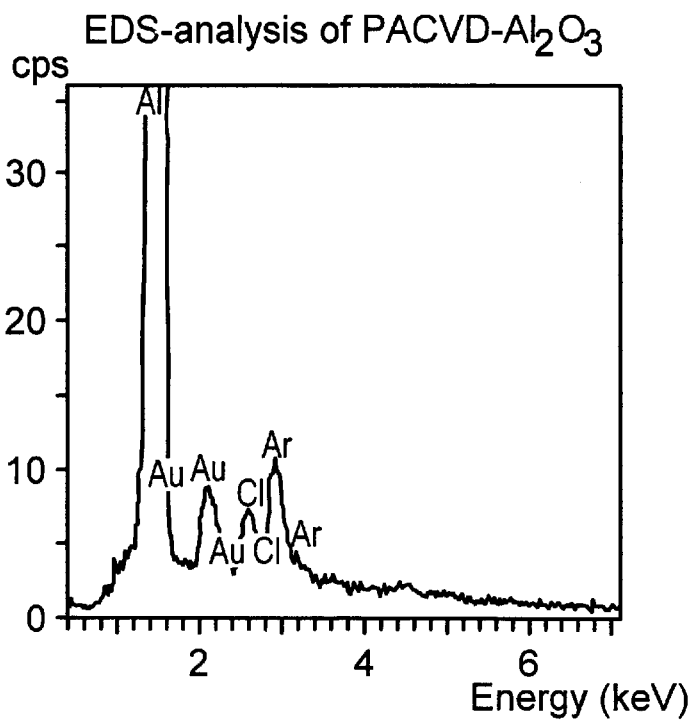
FIG. 1 is an EDS-analysis of an Al₂O₃ layer deposited by PACVD having an Al₂O₃ precursor.
Figure 2:
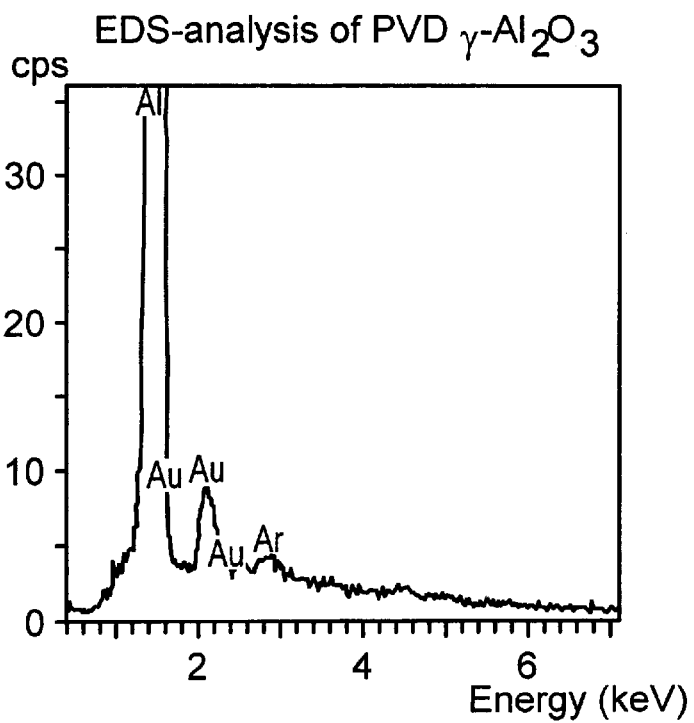
FIG. 2 is an EDS-analysis of a γ-Al₂O₃ layer deposited according to the present invention.
Figure 3:
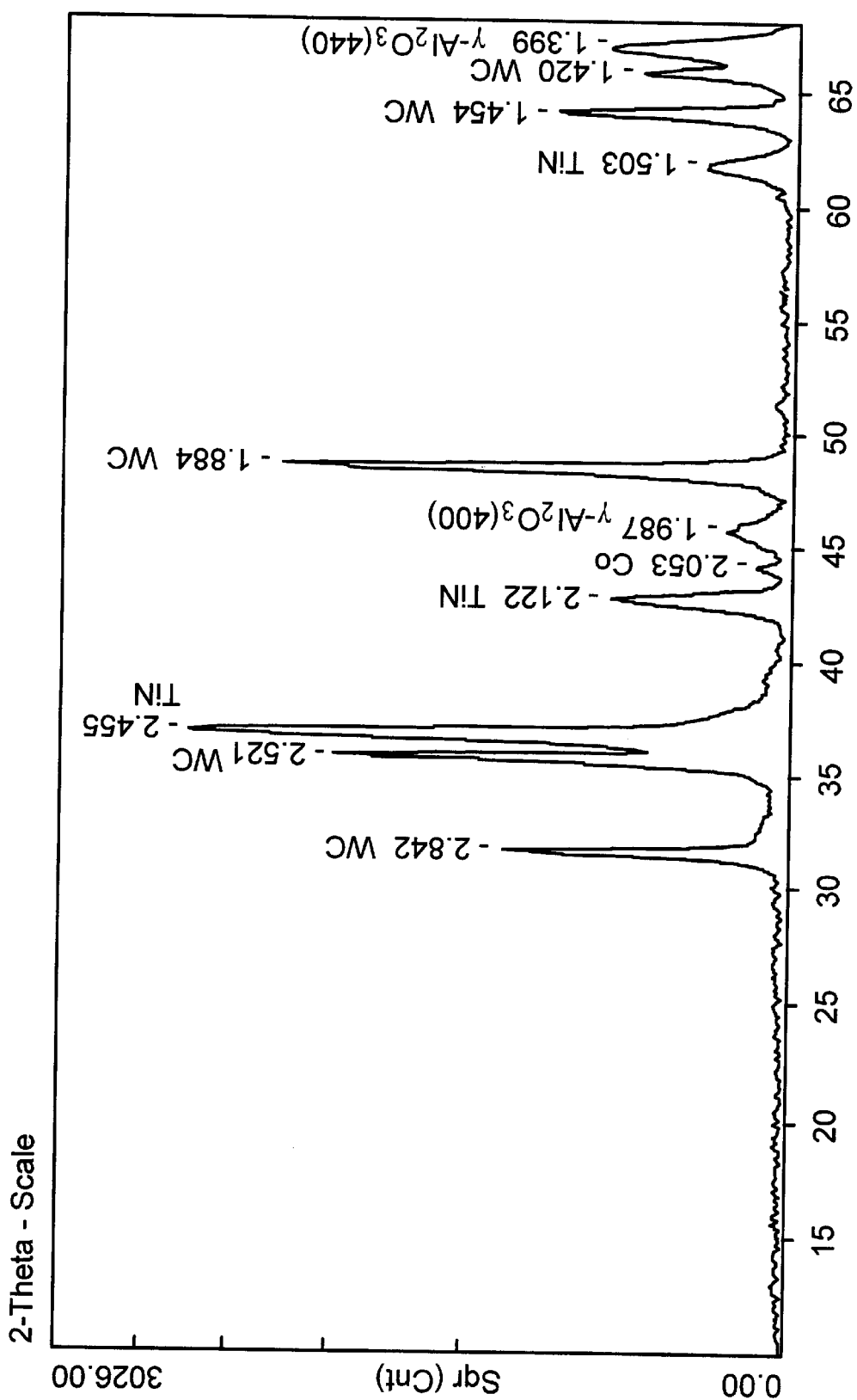
FIG. 3 is an X-ray diffraction pattern of an Al₂O₃ coating of the present invention.
Figure 4:
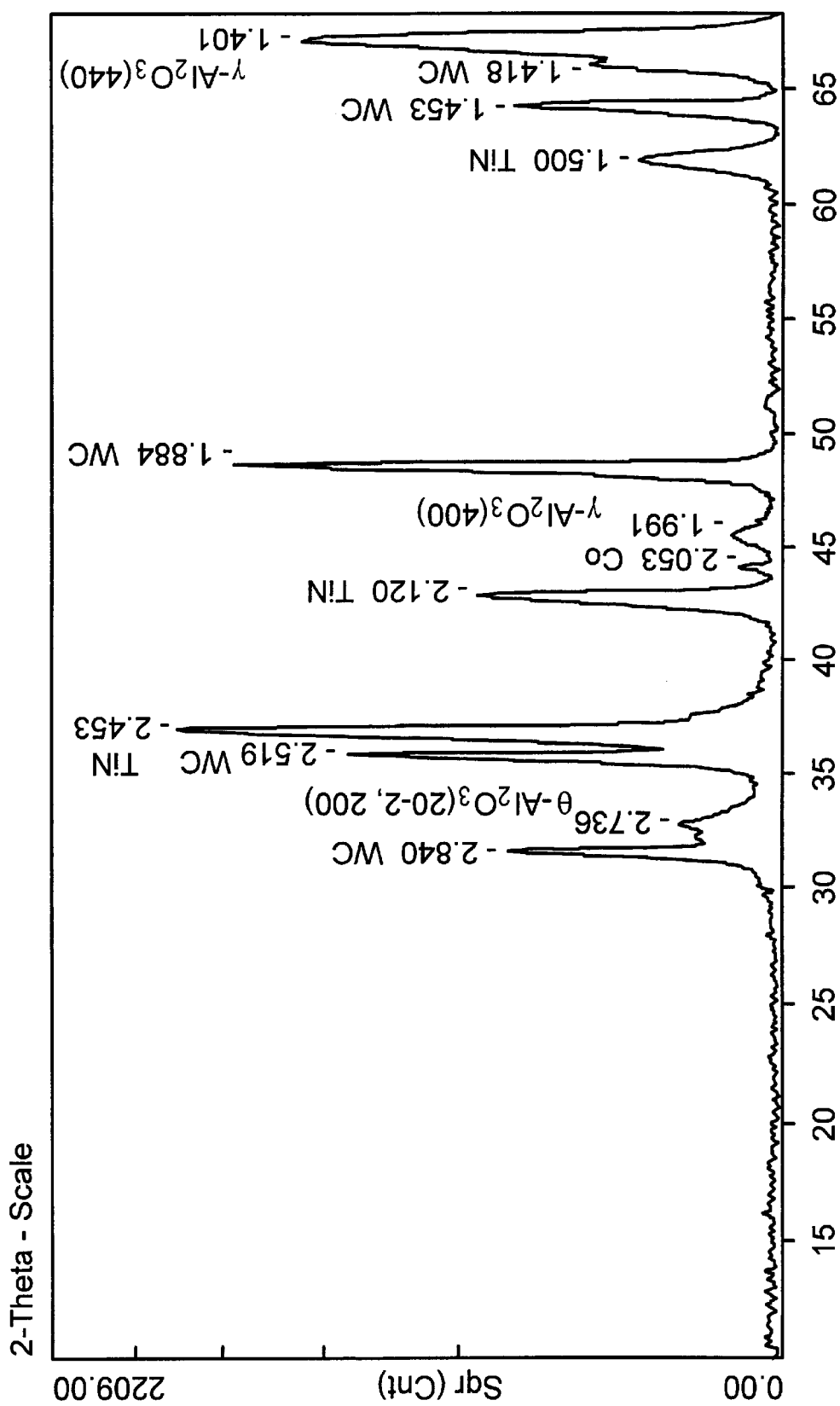
FIG. 4 is another X-ray diffraction pattern of an Al₂O₃ coating of the present invention.

The γ-Al₂O₃ layers according to the invention further give the cutting edges of the tool an extremely smooth surface finish which, compared to prior art α-Al₂O₃ coated tools, results in an improved surface finish also of the workpiece being machined. The very smooth surface finish can be attributed to the very fine crystallinity of the coating. The "γ-Al₂O₃" layers may also partially contain other phases from the "γ-series" like θ, δ and η. Identification of the γ- and/or θ-phases in the Al₂O₃ layers according to the invention can preferably be made by X-ray diffraction. Reflexes from the (400) and (440) planes of the γ-Al₂O₃ layers occurring at the 2θ-angles 45.8° and 66.8° when using $Cu_{K\alpha}$ radiation, unequivocally identifies the γ-phase (FIG. 3). Weaker reflexes from the (222), (200) and (311) planes of the γ-phase can occasionally be identified. When the θ-phase is present in the Al₂O₃ layers according to the invention, said phase is identified by the reflexes from the (200, 20-2) planes (FIG. 4).

Figure 5:
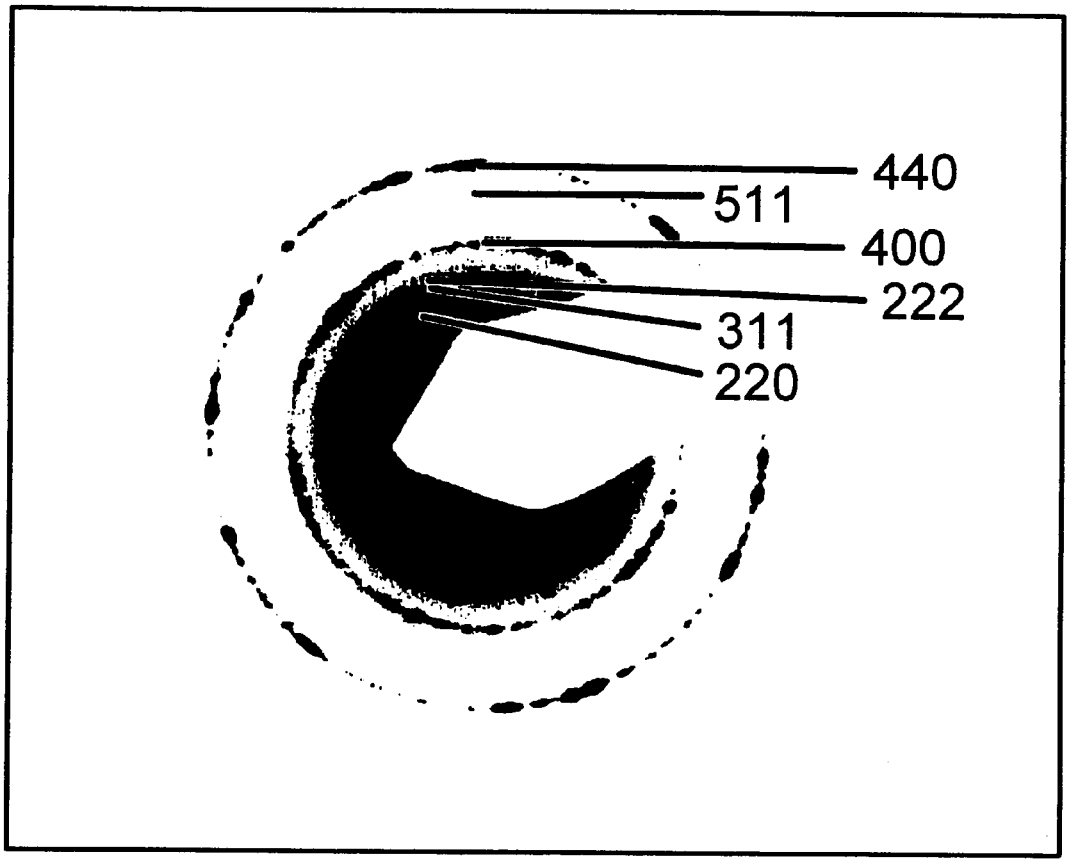
FIG. 5 is a diffraction pattern taken from a transmission TElectron Microscope.

A second identification method for the Al₂O₃ phases is based on electron diffraction in a Transmission Electron Microscope (TEM). A diffraction pattern from an Al₂O₃ layer deposited at a substrate temperature of 650° C. is shown in FIG. 5. The pattern shows rings from a polycrystalline phase with grains considerably smaller than the diameter of the electron beam and, furthermore, the intensity of the rings and the distances between the rings again unequivocally identifies the γ-phase of Al₂O₃.

The fine-grained, crystalline γ-Al₂O₃ according to the invention is strongly textured in the [440]-direction. A Texture Coefficient, TC, can be defined as:

$$TC(hkl) = \frac{I(hkl)}{I_O(hkl)} \left\{ \frac{1}{n} \sum \frac{I(hkl)}{I_O(hkl)} \right\}^{-1}$$

where

I(hkl)=measured intensity of the (hkl) reflection $I_o$(hkl)=standard intensity from the ASTM standard powder pattern diffraction data n=number of reflections used in the calculation (hkl) reflections used are: (111), (311), (222), (400) and (440) and whenever the TC(hkl)>1, there is a texture in the [hkl]-direction. The larger the value of TC(hkl), the more prenounced is the texture.

According to the present invention, the TC for the set of (440) crystal planes is greater than 1.5.

When the very fine-grained γ-Al₂O₃ coated cemented carbide cutting tools according to the invention are used in the machining of steel or cast iron, several important improvements compared to the prior art have been observed which will be demonstrated in the forthcoming examples. Surprisingly, the PVD γ-Al₂O₃ without containing any portion of the coarser and thermodynamically stable α-Al₂O₃ phase, shows in certain metal machining operations, a wear resistance which is equal to the wear resistance found in coarser CVD α-Al₂O₃ coatings deposited at temperatures around 1000° C. Furthermore, the fine-grained PVD γ-Al₂O₃ coatings show a wear resistance considerably better than prior art PVD coatings. These observations open up the possibility to considerably improve the cutting performance and prolong the tool lives of coated PVD tools. The low deposition temperature will also make it possible to deposit PVD γ-Al₂O₃ coatings on high speed steel tools.

A further improvement in cutting performance can be anticipated if the edges of the γ-Al₂O₃ coated cutting tools according to the invention are treated by a gentle wet-blasting process or by edge brushing with SiC based brushes. and An example of such brushes is disclosed in the Swedish patent application 9402234-4.

The total coating thickness according to the present invention varies between 0.5 and 20 µm, preferably between 1 and 15 µm with the thickness of the non-Al₂O₃ layer(s) varying between 0.1 and 10 µm, preferably between 0.5 and 5 µm. The fine-grained γ-Al₂O₃ coating can also be deposited directly onto the cutting tool substrate of cemented carbide, cermet, ceramics or high speed steel and the thickness of said γ-Al₂O₃ varies then between 0.5 and 15 µm preferably between 1 and 10 μm. Likewise can further coatings of metal nitrides and/or carbides with the metal elements selected from Ti, Nb, Hf, V, Ta, Mo, Zr, Cr, W and Al be deposited on top of of the $Al_2O_3$ layer.

The γ-$Al_2O_3$ layer according to the invention is deposited by a bipolar dual magnetron sputtering technique at substrate temperatures of 450°–700° C., preferably 550°–650° C., using aluminium targets, a gas mixture of Ar and $O_2$ and a process pressure in the range 1–5 μbar. The substrate may be floating or pulsed biased, the exact conditions depending to a certain extent on the design of the equipment being used.

It is within the purview of the skilled artisan to determine whether the requisite grainsize and phase compositions have been obtained and to modify the deposition conditions in accordance with the present specification, if desired, to affect the nanostructure of the $Al_2O_3$ layer within the frame of the invention.

The layer(s) described in the present invention, comprising metal nitrides and/or carbides and/or carbonitrides and with the metal elements selected from Ti, Nb, Hf, V, Ta, Mo, Zr, Cr, W and Al can be deposited by PVD-technique, CVD- and/or MTCVD-technique (Medium Temperature Chemical Vapor Deposition).

The superiority of the fine-grained γ-$Al_2O_3$ PVD layers according to the present invention, compared to prior art PVD coatings is demonstrated in Examples 1, 2 and 5. Examples 3, 4 and 6 demonstrate the suprisingly good wear resistance properties of the fine-grained γ-$Al_2O_3$ layers compared to traditionally CVD-deposited single phase κ-$Al_2O_3$ and single phase α-$Al_2O_3$ layers.

EXAMPLE 1

A) Commercially available cemented carbide threading inserts of style R166.OG-16MM01-150 having a composition of 10 w %/ Co and balance WC, coated with an approximately 2 μm TiN layer by an ion plating technique.

B) TiN coated tools from A) were coated with a 1 μm fine-grained γ-$Al_2O_3$ layer in a separate experiment with the pulsed magnetron sputtering technique. The deposition temperature was 650° C. and the process pressure was 1 μbar.

C) Cemented carbide threading inserts of style R166.OG-16MM01-150 having a composition of 10 w % Co and balance WC, coated with an approximately 3 μm TiN layer by an ion plating technique.

Coated tool inserts from B) and C) were then tested in a threading operation at a customers site in the production of engine oil plugs of cast iron (SS0125; 180–240 HB). The thread of the plug being produced was of size M36×1.5.

| Cutting data: | |
| --- | --- |
| Speed: | 154 m/min |
| | 5 passages per thread |

The results below is expressed as the number of machined plugs per cutting edge.

| C) prior art | 300 plugs | Large crater wear, cutting edge is worn out |
| --- | --- | --- |
| B) invention | >500 plugs | No detectable wear on the cutting edge. The edge can produce more plugs |

From the above results it is obvious that the alumina coated insert according to the invention is superior with respect to cutting performance.

EXAMPLE 2

D) Commercial PVD-TiN coated cemented carbide drilling inserts of style LCMX 040308-53 with a coating thickness of approximately 3 μm having a cemented carbide composition of 10 w % Co and balance WC.

E) TiN coated tools from D), coated with a 1 μm fine-grained γ-$Al_2O_3$ layer in a separate experiment with the pulsed magnetron sputtering technique. The deposition temperature was 650° C. and the process pressure was 1 μbar.

The alumina coating from E) appeared transparent and very smooth. SEM studies of a fracture cross section of the alumina coating showed a very fine-grained structure. A XRD-investigation identified the alumina phase as pure γ-$Al_2O_3$.

Coated tool inserts from D) and E) were then tested in a drilling operation in a workpiece material of a low alloyed, non-hardened steel (SS 2541).

| Cutting data: | |
| --- | --- |
| Speed: | 150 m/min |
| Feed: | 0.12 mm/rev |
| Hole diameter: | 25 mm |
| Hole depth: | 46 mm |
| | Coolant being used |

Both flank and crater wear were developed on the cutting edges. The extent of the flank wear determined the life time of the cutting tool. The results below express the number of holes being drilled per cutting edge.

| D) prior art | 150 holes | Flank wear 0.15 mm |
| --- | --- | --- |
| | 200 holes | Flank wear 0.22 mm, cutting edge is damaged |
| E) invention | 150 holes | Flank wear 0.07 mm |
| | 200 holes | Flank wear 0.09 mm |
| / | 250 holes | Flank wear 0.10 mm, cutting edge is slightly damaged |

From the above results it is obvious that the alumina coated inserts according to the invention are able to drill more holes than the prior art inserts.

EXAMPLE 3

F) Cemented carbide inserts of style CNMA 120412-KR having a composition of 6 w % Co and balance WC, coated with a first layer of 8 μm TiCN and thereafter with a top layer of 4.7 μm α-$Al_2O_3$. Both the TiCN and the $Al_2O_3$ layer were deposited by conventional CVD-technique. The $Al_2O_3$ layer had an average grain size of 1.2 μm.

G) Cemented carbide inserts of the same style and composition as in F), first coated with an approximately 3.6 μm TiCN layer by conventional CVD-technique and thereafter coated with a 2.3 μm fine-grained γ-$Al_2O_3$ layer in a separate experiment with the pulsed magnetron sputtering technique. The deposition temperature was 650° C. and the process pressure was 1 μbar.

Coated inserts from F) and G) were then tested in a continuous turning operation in a ball bearing steel (Ovako 825). The crater wear of the cutting edges was measured.

Cutting data:

| | |
|---|---|
| Speed: | 210 m/min |
| Feed: | 0.25 mm/rev |
| Depth of cut: | 2.0 mm |
| | Coolant being used |

The cutting operation was periodically interupted in order to measure the crater wear of the cutting edges. The crater wear was measured in an optical microscope. The machining time until the $Al_2O_3$ layer was worn through, was registered (i.e. when the inner TiCN coating just becoming visible). In order to define a figure of merit for the intrinsic wear resistance of the $Al_2O_3$ layers, the thickness ($\mu$m) of the $Al_2O_3$ layer was divided by the above defined machining time (min). The results below express the wear rate figure of merit.

| | |
|---|---|
| F) prior art $\alpha$-$Al_2O_3$ layers | 0.5 $\mu$m/min |
| C) invention | 0.5 $\mu$m/min |

From the above results it is obvious that the wear resistance of the fine-grained $\gamma$-$Al_2O_3$ layer suprisingly is as good as the wear resistance of the coarser-grained $\alpha$-$Al_2O_3$ layer deposited by CVD technique.

EXAMPLE 4

H) Cemented carbide inserts of style CNMA 120412-KR having a composition of 6 w % Co and balance WC, coated with a first layer of 6 $\mu$m TiCN and thereafter with a top layer of 1.1 $\mu$m $\kappa$-$Al_2O_3$. Both the TiCN and the $Al_2O_3$ layer were deposited by conventional CVD technique. The $Al_2O_3$ layer had an average grain size of 1 $\mu$m.

I) Cemented carbide inserts of the same style and composition as in H), coated with an approximately 2.5 $\mu$m TiN layer by an ion plating technique.

J) TiN coated tools from I), coated with a 1.2 $\mu$m fine-grained $\gamma$-$Al_2O_3$ layer in a separate experiment with the pulsed magnetron sputtering technique. The deposition temperature was 600° C. and the process pressure was 1 $\mu$bar.

K) TiN coated tools from I), coated with a 1.7 $\mu$m fine-grained $\gamma$-$Al_2O_3$ layer in a separate experiment with the pulsed magnetron sputtering technique. The deposition temperature was 730° C. and the process pressure was 1 $\mu$bar.

Coated inserts from H), J) and K), were then tested in a continuous turning operation in a ball bearing steel (Ovako 825). The crater wear of the cutting edges was measured.

| | |
|---|---|
| Speed: | 250 m/min |
| Feed: | 0.25 mm/rev |
| Depth of cut: | 2.0 mm |
| | Coolant being used |

The cutting operation was periodically interupted in order to measure the crater wear of the cutting edges. The crater wear was measured in an optical microscope. The machining time until the $Al_2O_3$ layer was worn through, was registered (i.e. when the inner TiN or TiCN coating just becoming visible). In order to define a figure of merit for the intrinsic wear resistance of the $Al_2O_3$ layers, the thickness ($\mu$m) of the $Al_2O_3$ layer was divided by the above defined machining time (min). The results below express the wear rate figure of merit.

| | |
|---|---|
| H) prior art $\kappa$-$Al_2O_3$ layers | 0.44 $\mu$m/min |
| J) invention TiN + $\gamma$-$Al_2O_3$ | 0.40 $\mu$m/min |
| K) invention TiN + $\gamma$-$Al_2O_3$ | 0.46 $\mu$m/min |

From the above results it is obvious that the wear resistance of the fine-grained $\gamma$-$Al_2O_3$ layer suprisingly is as good as the wear resistance of the coarser-grained $\kappa$-$Al_2O_3$ layer deposited by CVD technique.

EXAMPLE 5

Coated cutting inserts from I), J) and K) in Example 4 were tested under the same cutting conditions and cutting data as in Example 4. The machining time until a predetermined crater wear had developed on the rake face of the inserts was registered. The results below express said machining time until the predetermined crater wear.

| | |
|---|---|
| I) prior art TiN | 4 min |
| J) invention TiN + $\gamma$-$Al_2O_3$ | 9 min |
| K) invention TiN + $\gamma$-$Al_2O_3$ | 9.7 min |

From the above results it is obvious that a top coating of the fine-grained $\gamma$-$Al_2O_3$ layer on PVD TiN considerably improves the crater wear resistance of the cutting tool.

EXAMPLE 6

L) Cemented carbide inserts of style CNMA 120412-KR having a composition of 6 w % Co and balance WC, coated with a first layer of 6 $\mu$m TiCN and thereafter with a top layer of 4.8 $\mu$m $\alpha$-$Al_2O_3$. Both the TiCN and the $Al_2O_3$ layer were deposited by conventional CVD-technique. The $Al_2O_3$ layer had an average grain size of 1 $\mu$m.

M) Cemented carbide inserts of the same style and composition as in L), first coated with an approximately 5 $\mu$m TiAlN layer and thereafter, without vacuum interruption, coated with a 4.4 $\mu$m fine-grained $\gamma$-$Al_2O_3$ layer, both layers deposited with the pulsed magnetron sputtering technique. The deposition temperature was 600° C. and the process pressure was 1 $\mu$bar.

Coated inserts from L) and M) were then tested in a continuous turning operation in a low alloyed, non-hardened steel (SS2541). The crater wear of the cutting edges was measured.

| | |
|---|---|
| Speed: | 250 m/min |
| Feed: | 0.25 mm/rev |
| Depth of cut: | 2.0 mm |
| | Coolant being used |

The cutting operation was periodically interupted in order to measure the crater wear of the cutting edges. The crater wear was measured in an optical microscope. The machining time until the $Al_2O_3$ layer was worn through, was registered (i.e. when the inner TiCN or TIAlN coating just becoming visible). In order to define a f igure of merit for the intrinsic wear resistance of the $Al_2O_3$ layers, the thickness ($\mu$m) of the $Al_2O_3$ layer was divided by the above defined machining time (min). The results below express the wear rate figure of merit.

| L) prior art α-Al₂O₃ layers | 0.69 μm/min |
|---|---|
| M) invention | 0.73 μm/min |

From the above results it is obvious that the wear resistance of the fine-grained γ-Al₂O₃ layer suprisingly is as good as the wear resistance of the coarser-grained α-Al₂O₃ layer deposited by CVD technique.

The principles, in preferred embodiments of the present invention have been described in the foregoing specification. However, the invention which is intended to be protected is not to be construed as limited to the particular embodiments disclosed above. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the invention be embraced thereby.

What is claimed is:

1. An article comprising:
a substrate; and
a coating deposited onto the substrate comprising a crystalline γ-Al₂O₃ phase having a grain size less than 0.1 μm, a hardness of at least 20 GPa, a compressive stress of at least 1 GPa, and is essentially free of halogen impurities;
wherein the coating is deposited by a DMS PVD technique at a substrate temperature of 450°–700° C.

2. An article comprising:
a substrate; and
a coating deposited on the substrate, the coating comprising a γ-Al₂O₃ phase without containing any portion of α-Al₂O₃ phase, the coating having a hardness of at least 20 GPa, a compressive stress of at least 1 GPa, and is essentially free of halogen impurities.

3. The article of claim 2, wherein the γ-Al₂O₃ has a grain size less than 0.1 μm.

4. The article of claim 2, wherein the coating is deposited by a DMS PVD technique at a substrate temperature of 450°–700° C.

* * * * *